US012648421B2

(12) United States Patent
Kim

(10) Patent No.: US 12,648,421 B2
(45) Date of Patent: Jun. 2, 2026

(54) METHODS OF MANUFACTURING SEMICONDUCTOR DEVICES INCLUDING SEPARATION PATTERNS

(71) Applicant: SK hynix Inc., Gyeonggi-do (KR)

(72) Inventor: Myung Ok Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 393 days.

(21) Appl. No.: 18/366,684

(22) Filed: Aug. 8, 2023

(65) Prior Publication Data

US 2024/0420999 A1 Dec. 19, 2024

(30) Foreign Application Priority Data

Mar. 22, 2023 (KR) ........................ 10-2023-0037614

(51) Int. Cl.
*H10W 20/00* (2026.01)
*H10W 20/41* (2026.01)
*H10W 20/43* (2026.01)

(52) U.S. Cl.
CPC ....... *H10W 20/063* (2026.01); *H10W 20/057* (2026.01); *H10W 20/425* (2026.01); *H10W 20/43* (2026.01)

(58) Field of Classification Search
CPC .............................. H10B 12/09; H10B 12/033
See application file for complete search history.

(56) References Cited

U.S. PATENT DOCUMENTS

| | | | | |
|---|---|---|---|---|
| 5,973,348 | A | * 10/1999 | Ishibashi | .............. H10B 12/485 257/306 |
| 10,236,382 | B2 | 3/2019 | Cheng et al. | |
| 2003/0087517 | A1* | 5/2003 | Lee | ........................ H10B 12/09 257/E21.507 |
| 2005/0009350 | A1 | 1/2005 | Vogt | |
| 2007/0262417 | A1* | 11/2007 | Ohtake | .............. H01L 23/5223 257/532 |
| 2008/0305623 | A1 | 12/2008 | Zhuang et al. | |
| 2013/0092993 | A1* | 4/2013 | Hijioka | ............. H01L 21/76897 257/E29.345 |
| 2015/0270271 | A1* | 9/2015 | Sakamoto | .............. H10D 1/042 257/306 |
| 2017/0025420 | A1* | 1/2017 | Park | ........................ H10B 12/09 |

FOREIGN PATENT DOCUMENTS

| | | | |
|---|---|---|---|
| KR | 10-0714893 | B1 | 5/2007 |
| KR | 10-2015-0109264 | A | 10/2015 |
| KR | 10-2021-0001109 | A | 1/2021 |
| KR | 10-2022-0003922 | A | 1/2022 |

* cited by examiner

*Primary Examiner* — Erik Kielin
(74) *Attorney, Agent, or Firm* — IP & T GROUP LLP

(57) ABSTRACT

There is disclosed a method of manufacturing a semiconductor device including a separation pattern. An intermediate structure layer including first conductive pillars and second conductive pillars is formed over a semiconductor substrate. A separation layer is formed. Some portions of the separation layer is selectively removed to form a separation pattern, and third conductive patterns filling holes of the separation pattern and fourth conductive patterns filling trenches of the separation pattern are formed.

17 Claims, 17 Drawing Sheets

METHODS OF MANUFACTURING SEMICONDUCTOR DEVICES INCLUDING SEPARATION PATTERNS

CROSS-REFERENCE TO RELATED APPLICATIONS

The present application claims priority under 35 U.S.C. 119 (a) to Korean Application No. 10-2023-0037614, filed on Mar. 22, 2023, which is incorporated herein by reference in its entirety.

BACKGROUND

1. Technical Field

The present disclosure generally relates to integrated circuit devices and, more particularly, to methods of manufacturing semiconductor devices including separation patterns.

2. Related Art

Integrated circuit devices may be integrated over a semiconductor substrate to constitute semiconductor devices. As design rules required for the semiconductor devices rapidly decrease, spaces between conductive patterns constituting the integrated circuit devices are rapidly decreasing. Accordingly, unwanted bridges may occur between the conductive patterns.

SUMMARY

An embodiment of the present disclosure may provide a method of manufacturing a semiconductor device including forming an intermediate structure layer including first conductive pillars and second conductive pillars over a semiconductor substrate, forming a separation layer covering the intermediate structure layer, forming a separation pattern by selectively removing some portions of the separation layer, the separation pattern being formed to provide holes exposing some portions of the first conductive pillars and trenches exposing some portions of the second conductive pillars and extending, and forming third conductive patterns filling the holes of the separation pattern and fourth conductive patterns filling the trenches of the separation pattern.

Another embodiment of the present disclosure may provide a method of manufacturing a semiconductor device including forming an intermediate structure layer including first and second conductive pillars extending over a cell region and a peripheral region of a semiconductor substrate, respectively, forming a separation pattern comprising holes exposing portions of the first conductive pillars and trenches exposing portions of the second conductive pillars, and forming conductive patterns by filling the holes and the trenches of the separation pattern.

These and other features and advantages of the present invention may become better understood from the following detailed description of example embodiments in conjunction with the following figures.

BRIEF DESCRIPTION OF THE DRAWINGS

FIGS. 1 to 6 are schematic views illustrating formation of an intermediate structure layer in a method of manufacturing a semiconductor device according to an embodiment of the present disclosure.

FIGS. 7 to 12 are schematic views illustrating formation of a separation pattern in the method of manufacturing a semiconductor device according to an embodiment of the present disclosure.

FIGS. 13 and 14 are schematic cross-sectional and plane views illustrating formation of conductive patterns in the method of manufacturing a semiconductor device according to an embodiment of the present disclosure.

DETAILED DESCRIPTION

Figure 1:
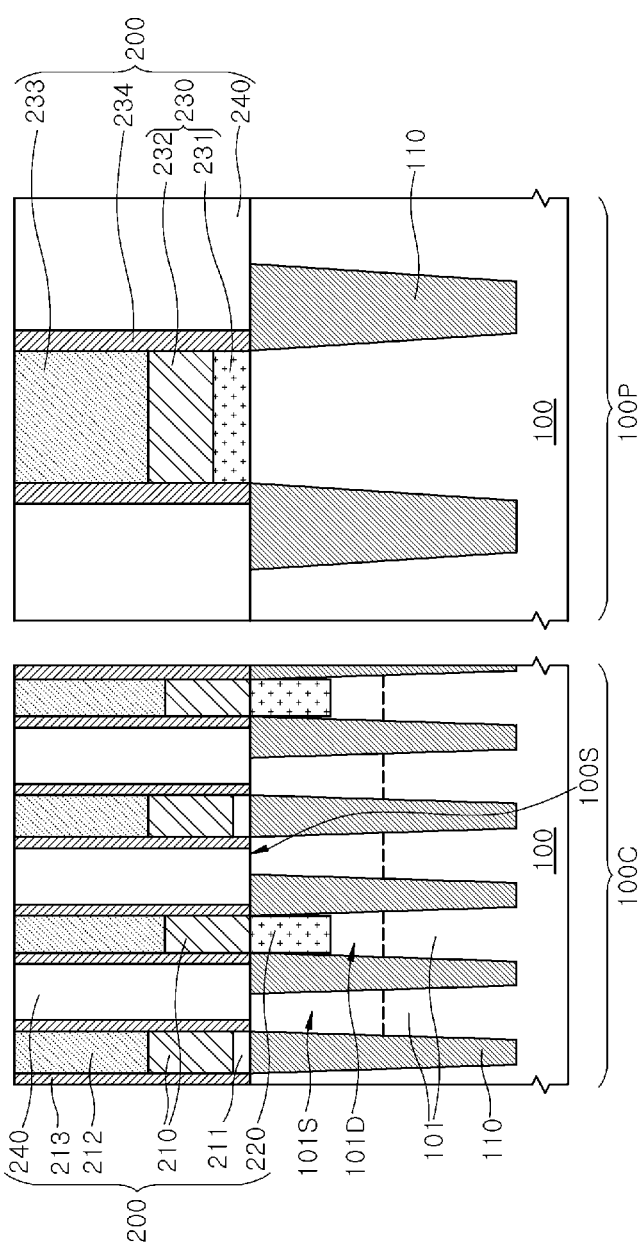

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

In the descriptions in the present disclosure, descriptions such as "first" and "second," "bottom," "top," and "lower" are for distinguishing elements and are not used to limit the elements themselves or to imply a specific order. The descriptions mean a relative positional relationship, and do not limit a specific case in which another member is further introduced to direct contact with the element or at an interface between them. The same interpretation may be applied to other expressions describing the relationship between components.

Embodiments of the present disclosure may be applied to a technology field for implementing integrated circuit devices such as dynamic random access memory (DRAM) circuits, phase change random access memory (PcRAM) devices, or resistive random access memory (ReRAM) devices. In addition, the embodiments of the present disclosure may be applied to a technology field for implementing memory devices such as static random access memory (SRAM) devices, FLASH memory devices, magnetic random access memory (MRAM) devices, or ferroelectric random access memory (FeRAM) devices, or logic devices in which logic circuits are integrated. The embodiments of the present application may be applied to technical fields implementing various products requiring fine-sized conductive patterns.

Same reference numerals refer to same elements throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

FIGS. 1 to 6 are schematic views illustrating process steps for forming an intermediate structure layer 200 in a method of manufacturing a semiconductor device according to an embodiment of the present disclosure. The process steps presented in FIGS. 1 to 6 present a method of forming the intermediate structure layer 200 over a semiconductor substrate 100.

Referring to FIG. 1, isolation layers 110 may be formed in the semiconductor substrate 100. The isolation layers 110 may partition active regions 101. The semiconductor substrate 100 may include a semiconductor material such as, for example, silicon (Si). The semiconductor substrate 100 may include a semiconductor material such as germanium (Ge). The semiconductor substrate 100 may include a compound semiconductor material such as, for example, silicon carbide (SIC), gallium arsenide (GaAs), indium arsenide (InAs), or indium phosphorus (InP). The semiconductor substrate 100 may have a wafer shape.

Each of the isolation layers 110 may include a field oxide layer. Impurities may be implanted into the active regions 101 of the semiconductor substrate 100 to form first doped regions 101S and second doped regions 101D. The first doped region 101S may include a source region of one cell transistor. The second doped region 101D may include a drain region of the cell transistor.

Figure 2:
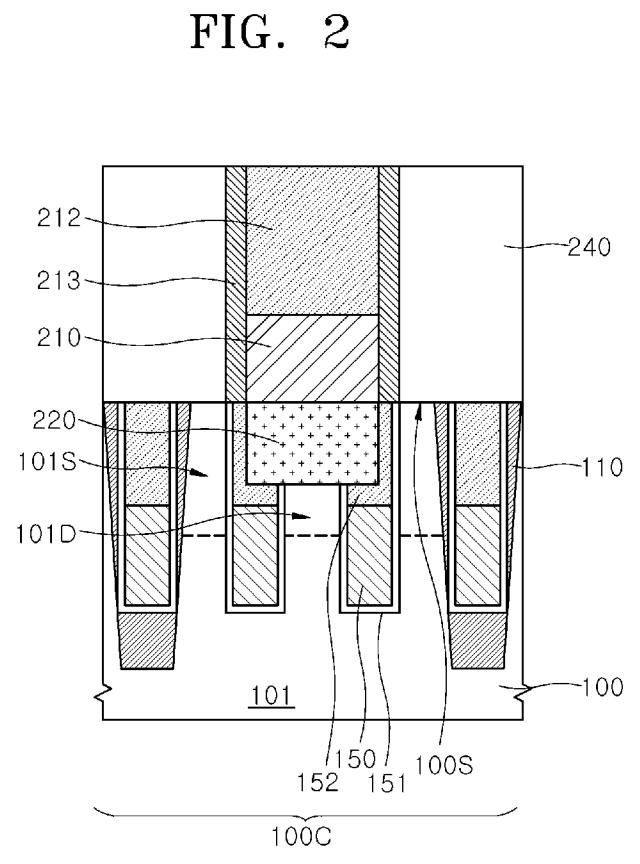

Referring now to FIG. 2, buried gate patterns 150 may be formed in the semiconductor substrate 100. FIG. 2 may show a cross-sectional shape obtained by cutting a first region 100C of the semiconductor substrate 100 in a direction different from that of FIG. 1. The buried gate patterns 150 may be formed by recessing some portions of the active regions 101 of the semiconductor substrate 100 and forming conductive layers in the recessed portions. Gate dielectric layers 151 may be formed between the buried gate patterns 150 and the active regions 101 of the semiconductor substrate 100. First capping layers 152 may be formed over the buried gate patterns 150 to cover the buried gate patterns 150 and fill the recessed portions. The first capping layer 152 may include a dielectric material.

Referring to FIGS. 1 and 2 again, bit line plugs 220 may be formed in the semiconductor substrate 100. The bit line plugs 220 may be formed in a shape passing through or infiltrating into the active regions 101. The active regions 101 are formed within the semiconductor substrate 100 and are portions of the semiconductor substrate 100. Each of the bit line plugs 220 may include a conductive material layer such as, for example, a doped poly-crystalline silicon layer. The bit line plugs 220 may be formed in the first region 100C of the semiconductor substrate 100.

When the bit line plugs 220 are formed over the first region 100C of the semiconductor substrate 100, a first gate layer 231 for a peripheral gate pattern 230 may also be formed over the second region 100P of the semiconductor substrate 100. A peripheral gate dielectric layer may be further formed between the first gate layer 231 and a lower portion of the semiconductor substrate 100. The first gate layer 231 may be a doped polysilicon layer. The first gate layer 231 may be formed together with the bit line plugs 220 in the process of forming the bit line plugs 220. For example, the first gate layer 231 may be formed simultaneously with the bit line plugs 220 in the process of forming the bit line plugs 220.

The first region 100C and the second region 100P of the semiconductor substrate 100 may be different regions distinguished from each other. For example, the first region 100C of the semiconductor substrate 100 may be a cell region, and the second region 100P of the semiconductor substrate 100 may be a peripheral region. The cell region 100C may comprise the main circuits constituting the semiconductor device. The peripheral region may comprise peripheral circuits for operating the main circuits. The semiconductor device may include a memory device such as DRAM device. Memory elements may be disposed in the cell region 100C, and the peripheral circuits such as sensing and amplifying circuits may be disposed in the peripheral region 100P. The memory elements may include cell transistor elements and cell capacitor elements.

Bit line patterns 210 and a peripheral gate pattern 230 may be formed over the semiconductor substrate 100. A conductive layer for the bit line patterns 210 may be formed over the semiconductor substate 100. A dielectric layer for a bit line hard mask layer 212 may be formed over the conductive layer for the bit line patterns 210. The dielectric layer for the bit line hard mask layer 212 and the conductive layer for the bit line patterns 210 may be patterned to form the bit line patterns 210 and patterns of the bit line hard mask layer 212, respectively over the first region 100C of the semiconductor substrate 100. The dielectric layer for the bit line hard mask layer 212 and the conductive layer for the bit line patterns 210 may be patterned to form a pattern of a second gate layer 232 for the peripheral gate pattern 230 and a pattern of a gate hard mask layer 233 over the second region 100P of the semiconductor substrate 100. The second gate layer 232 and the bit line patterns 210 may be separated from substantially the same conductive layer. The conductive layer for the bit line patterns 210 may include a metal layer such as a tungsten (W) layer. The conductive layer for the bit line patterns 210 may further include a barrier metal layer such as a titanium nitride (TiN) layer, a tungsten nitride (WN) layer, a titanium tungsten nitride (TiWN) layer, a tungsten silicon nitride (WSiN) layer, or a composite layer thereof.

Before forming the conductive layer for the bit line patterns 210, a second capping layer 211 may be further formed to electrically isolate the bit line patterns 210 from the semiconductor substrate 100. The second capping layer 211 may be made of an insulating material such as, for example, silicon nitride ($Si_3N_4$).

Bit line spacers 213 may be formed to cover side edges (or simply sides) of the bit line patterns 210 and the bit line hard mask layer 212. While forming the bit line spacers 213, a gate spacer 234 covering side edges (or simply sides) of the peripheral gate pattern 230 and the gate hard mask layer 233 may be formed simultaneously. The gate spacer 234 and the bit line spacers 213 may include substantially the same insulating material. The gate spacer 234 may insulate the side edges (or simply sides) of the peripheral gate pattern 230.

A dielectric layer 240 may be formed to cover and isolate the stack structures of the bit line patterns 210, the bit line hard mask layer 212, and the bit line spacers 213 and the stack structure of the peripheral gate pattern 230, the gate hard mask layer 233, and the gate spacer 234. The dielectric layer 240 may be made of an insulating material such as, for example, silicon oxide ($SiO_2$). The dielectric layer 240 may be planarized to cover the space between the stack structures of the bit line patterns 210, the bit line hard mask layer 212, and the bit line spacers 213 and also around the stack structure of the peripheral gate pattern 230, the gate hard mask layer 233, and the gate spacer 234 while exposing an upper surface of the bit line hard mask layer 212 and an upper surface of the gate hard mask layer 233. A chemical mechanical polishing (CMP) process may be used for such planarization.

Referring back to FIG. 1, in an embodiment, the first doped region 101S and the second doped region 101D may be formed after forming the stack structures of the bit line patterns 210, the bit line hard mask layer 212, and the bit line spacers 213, and the stack structure of the peripheral gate pattern 230, the gate hard mask layer 233, and the gate spacer 234. Alternatively, the first doped region 101S and the second doped region 101D may be formed before the bit line patterns 210 are formed.

FIG. 1 shows a cross-sectional shape of a cut surface crossing the plurality of neighboring bit line patterns 210. FIG. 2 shows a cross-sectional shape of another cut surface crossing the plurality of neighboring buried gate patterns 150. As the buried gate patterns 150 are formed inside the semiconductor substrate 100, the bit line patterns 210 may be located closer to a surface 100S of the semiconductor substrate 100. The buried gate patterns 150 may constitute cell transistors, together with the bit line patterns 210. As the buried gate patterns 150 are formed inside, i.e., buried in the semiconductor substrate 100, a channel length of the cell transistor and/or a length between a source region and a drain region may be further secured.

Figure 3:
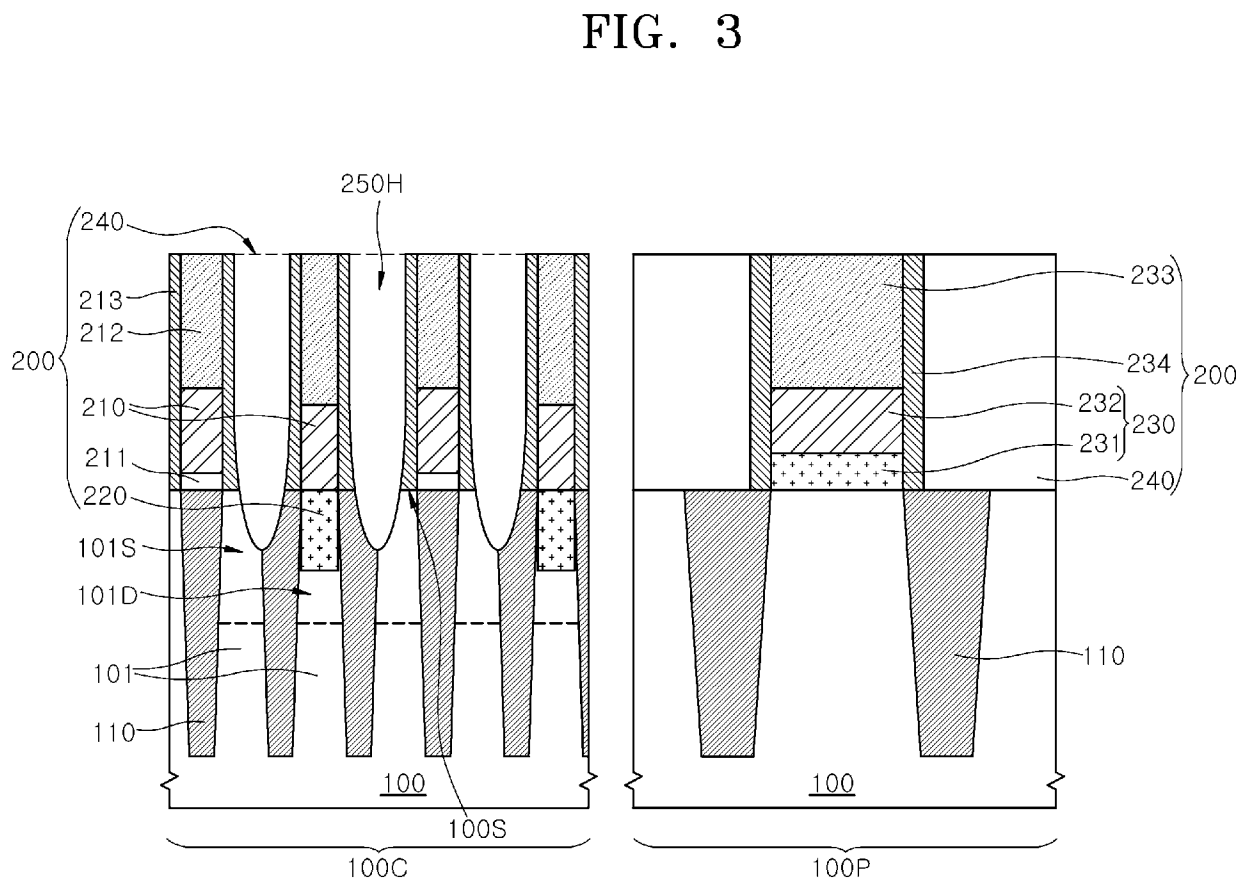

Referring to FIG. 3, first openings 250H for first conductive pillars may be formed to have a shape passing through the dielectric layer 240. The side surfaces of the bit line spacers 213 may be exposed to the first openings 250H. As the first openings 250H are formed in the shape that exposes the side surfaces of the bit line spacers 213, the first openings 250H may be self-aligned to the bit line spacers 213. Some portions of the semiconductor substrate 100 exposed at bottom surfaces of the first openings 250H during forming the first openings 250H may be further recessed. Accordingly, areas of the portions of the semiconductor substrate 100 exposed through the first openings 250H may be further increased.

Figure 4:
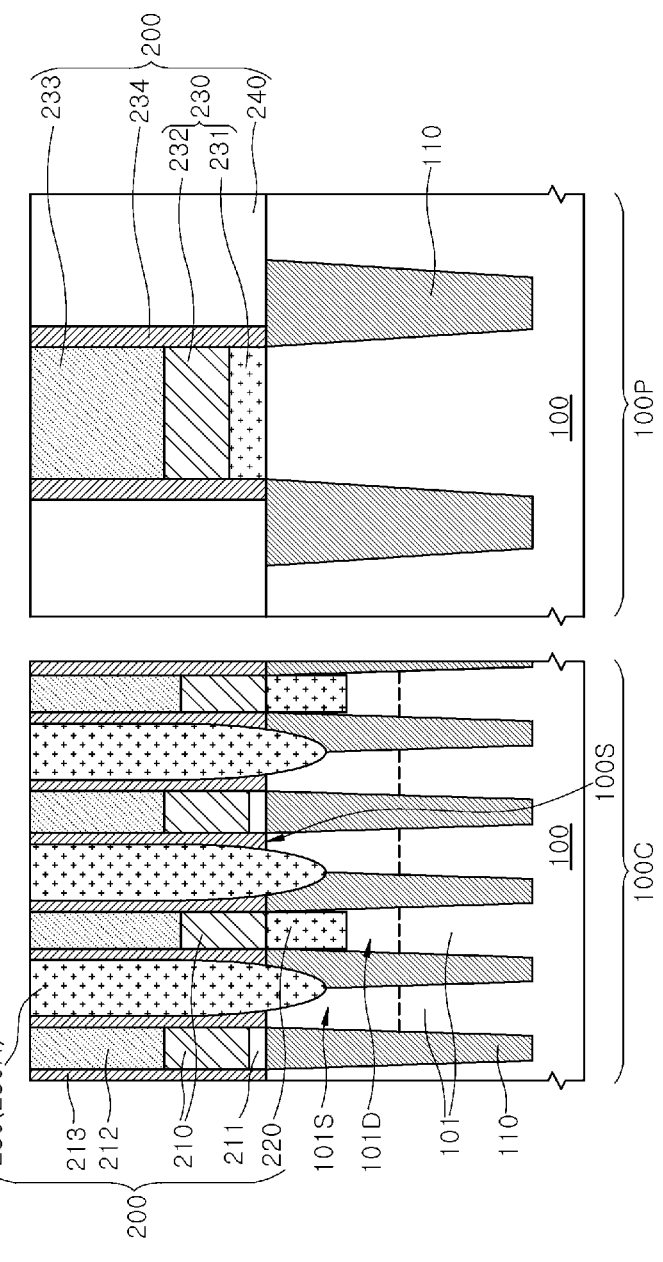

Referring to FIGS. 3 and 4, the first openings 250H may be filled with a conductive material to form first conductive pillars 250. After filling the first openings 250H with a conductive material, a layer of the conductive material extending above the first openings 250H may be planarized. Each of the first conductive pillars 250 may include a conductive material including doped poly-crystalline silicon. Because the first openings 250H are formed to remove some portions of the semiconductor substrate 100, the first conductive pillars 250 filling the first openings 250H may have a shape in which some portions of the first conductive pillars 250 pass through into the semiconductor substrate 100. The shape in which some portions of the first conductive pillars 250 pass through into the semiconductor substrate 100 may increase the contact area between the semiconductor substrate 100 and each of the first conductive pillars 250. Accordingly, a contact resistance between the semiconductor substrate 100 and each of the first conductive pillars 250 may be reduced.

Figure 5:
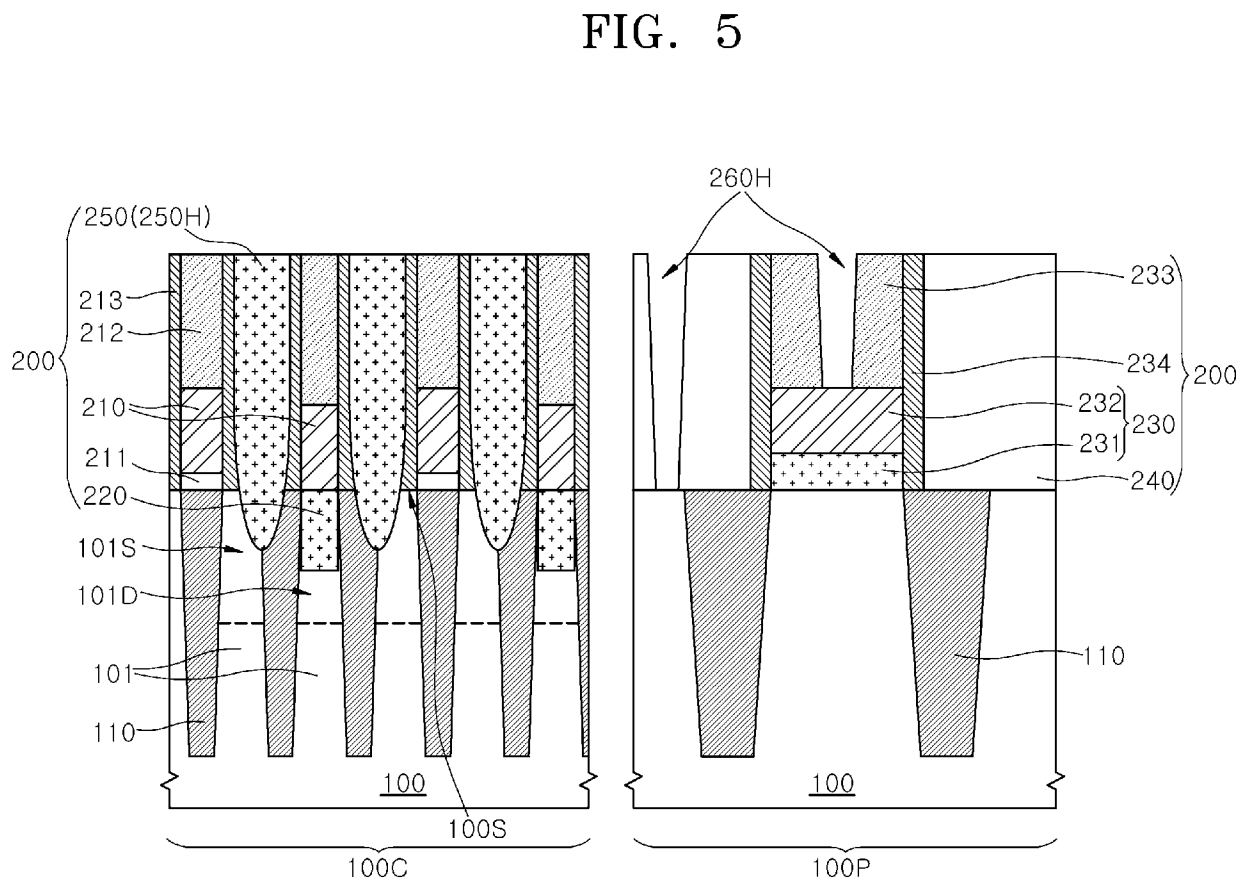

Referring to FIG. 5, second openings 260H for second conductive pillars may be formed. The second openings 260H may be formed to be located over the second region 100P of the semiconductor substrate 100. Some of the second openings 260H may be formed in a shape of holes exposing some portions of the semiconductor substrate 100 and passing through the dielectric layer 240. Others of the second openings 260H may be formed in a shape of holes passing through the gate hard mask layer 233 to expose some portions of the peripheral gate pattern 230.

Figure 6:
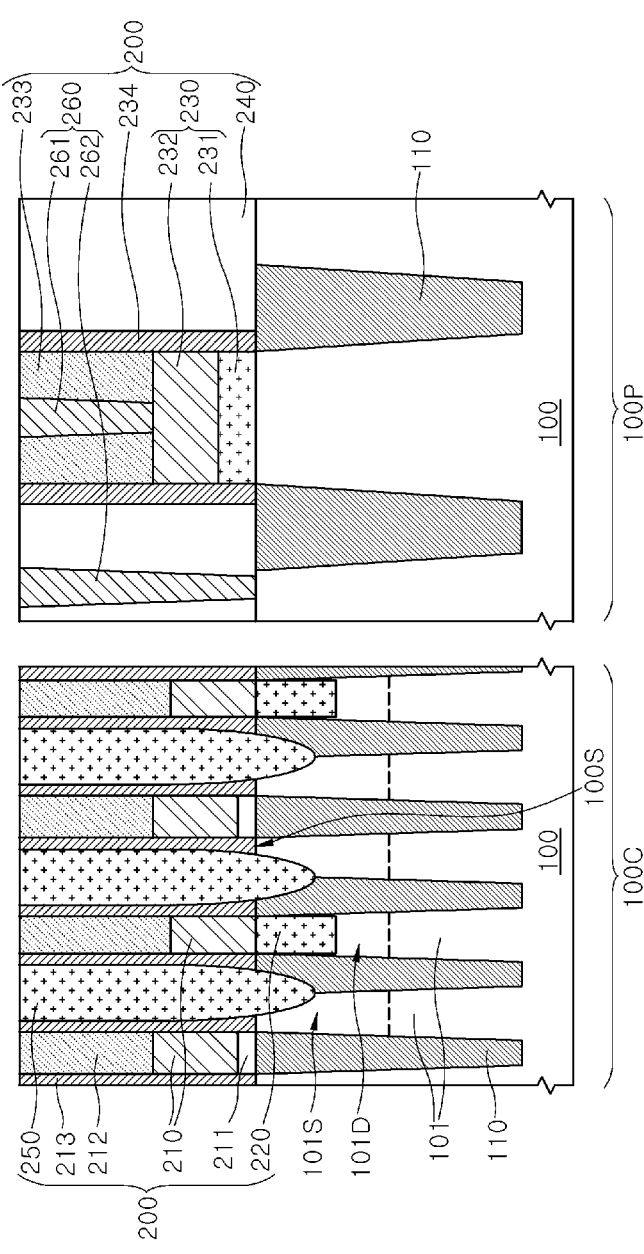

Referring to FIGS. 5 and 6, the second openings 260H may be filled with a conductive material to form second conductive pillars 260. Each of the second conductive pillars 260 may be formed of a conductive material such as doped poly-crystalline silicon or tungsten (W). After filling the second openings 260H with the conductive material, a layer of the conductive material extending over the second openings 260H may be planarized.

The first conductive pillars 250 and the second conductive pillars 260 may constitute an intermediate structure layer 200. The second conductive pillars 260 may be disposed in a region distinguished from a region in which the first conductive pillars 250 are disposed. The first conductive pillars 250 may be disposed in the first region 100C of the semiconductor substrate 100, and the second conductive pillars 260 may be disposed in the second region 100P of the semiconductor substrate 100. The first conductive pillars 250 may form connection elements electrically connecting the cell capacitor elements to the semiconductor substrate 100. The first conductive pillars 250 may be electrically connected to lower electrodes or storage nodes of the cell capacitor elements. The first conductive pillars 250 may form storage node contact (SNC) plugs.

The intermediate structure layer 200 may include peripheral transistors constituting the peripheral circuits. The peripheral gate pattern 230 located over the second region 100P of the semiconductor substrate 100 may constitute the peripheral transistor. The peripheral gate pattern 230 may be formed in the plurality of conductive layers including the first gate layer 231 and the second gate layer 232. Some of the second conductive pillars 260 indicated as conductive pillars 261 may be connected to the second gate layer 232 of the peripheral gate pattern 230.

The intermediate structure layer 200 may further include the dielectric layer 240 covering and insulating the peripheral gate pattern 230. The dielectric layer 240 may be an interlayer dielectric layer (ILD). The gate hard mask layer 233 may cover and electrically insulate the peripheral gate pattern 230. The second conductive pillars 261 may substantially pass through the gate hard mask layer 233 to be connected to the peripheral gate pattern 230. Other second conductive pillars 262 (which are part of the second conductive pillars 260) may substantially pass through the dielectric layer 240 to be connected to the semiconductor substrate 100. These second conductive pillars 262 may be metal contacts (MOCs) electrically connected to the semiconductor substrate 100. The metal contacts may be metallization elements closest to the semiconductor substrate 100 in a metallization structure or a multi-layer metallization structure of a semiconductor device.

Each of the first conductive pillars 250 may be formed in a shape of a storage node contact (SNC) plug. Each of the second conductive pillars 260 may be formed in a shape of a metal contact (MOC), so that the first conductive pillars 250 may be disposed in an arrangement different from that of the second conductive pillars 260. One end of each of the first conductive pillars 250 may be in contact with or connected to the semiconductor substrate 100 located below the intermediate structure layer 200. Some portions of the first conductive pillars 250 may extend to pass through into the semiconductor substrate 100. The first conductive pillars 250 may be formed to have substantially the same shape as each other. Each of the second conductive pillars 260 may have a shape different from that of each of the first conductive pillars 250. The second conductive pillars 260 may be formed to have different lengths from each other. The lengths of the second conductive pillars 260 may be lengths extending in a direction perpendicular to the surface 100S of the semiconductor substrate 100.

The intermediate structure layer 200 may include the bit line patterns 210. The bit line patterns 210 may be formed to be disposed over the first region 100C of the semiconductor substrate 100. A plurality of bit line patterns 210 may be disposed over the semiconductor substrate 100 to be spaced apart from each other. The first conductive pillars 250 may be formed to pass between the bit line patterns 210 and to be connected to or to contact the portions of the semiconductor substrate 100, exposed between the bit line patterns 210. The bit line spacers 213 formed over the side edges (or simply sides) of the bit line patterns 210 may electrically isolate the bit line patterns 210 and the first conductive pillars 250.

The bit line patterns 210 may be respectively connected to the bit line plugs 220. The bit line plugs 220 may be conductive connection elements formed to pass through into the portions of the semiconductor substrate 100. The bit line plugs 220 may extend below the surface 100S of the semiconductor substrate 100. The bit line plugs 220 pass through into the semiconductor substrate 100, so that the contact area where the bit line plugs 220 contact the semiconductor substrate 100 may be further secured. Accordingly, the contact resistance between the bit line plugs 220 and the semiconductor substrate 100 may be reduced.

FIGS. 7 to 12 are schematic views illustrating process steps of forming a separation pattern 300 over the intermediate structure layer 200 in the method of manufacturing a semiconductor device according to an embodiment of the present disclosure. The process steps presented in FIGS. 7 to 12 may present one method of implementing the separation pattern 300. The separation pattern 300 may be formed in various processes without being limited to these process steps.

Figure 7:
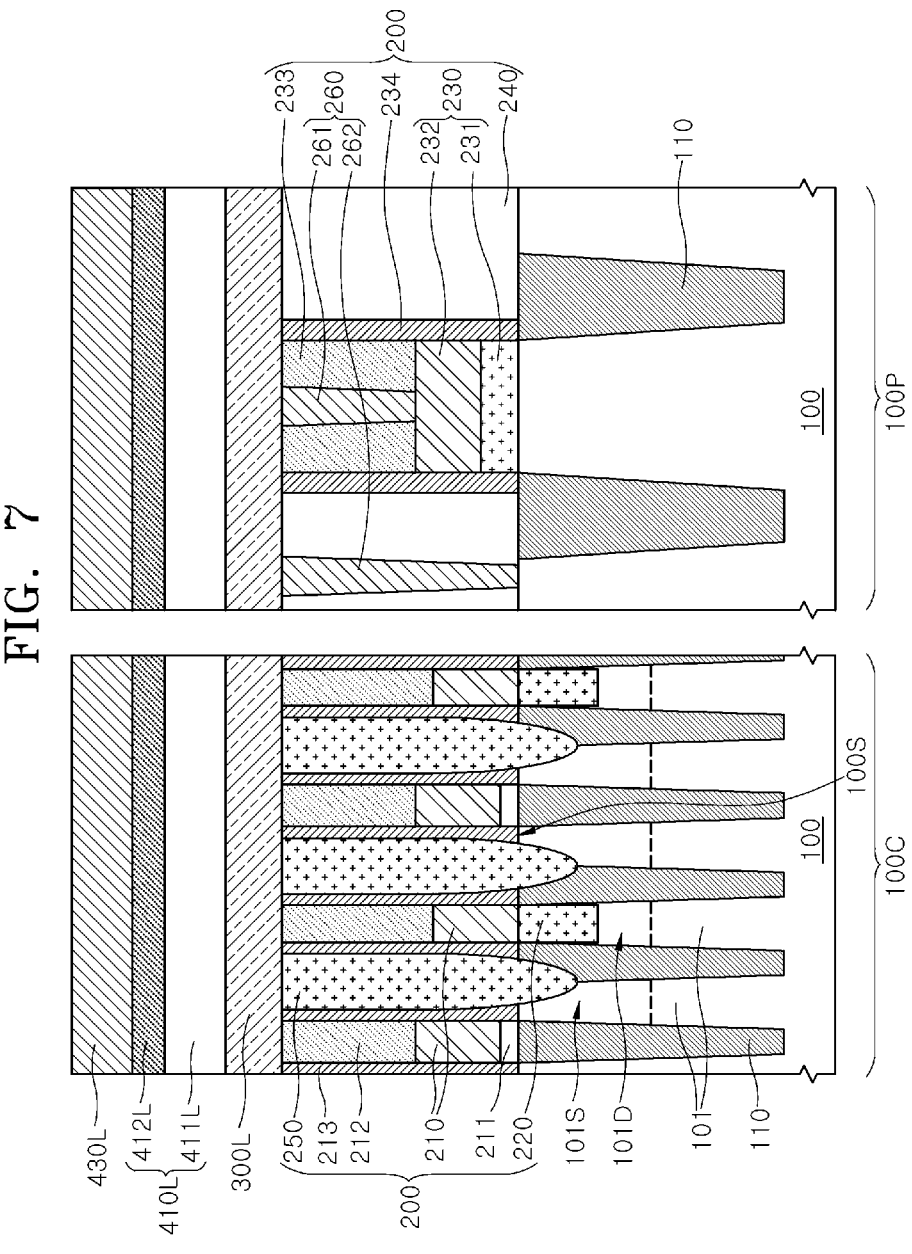

Referring to FIG. 7, a separation layer 300L may be formed over the intermediate structure layer 200 by depositing an insulating material or a dielectric material, such as, for example, silicon nitride. The separation layer 300L may extend to cover both the first region 100C and the second region 100P of the semiconductor substrate 100. A hard mask layer 410L may be formed over the separation layer 300L. The hard mask layer 410L may include a dielectric material capable of implementing an etch selectivity with respect to the separation layer 300L.

The hard mask layer 410L may be formed by stacking a plurality of layers of different dielectric materials. A first hard mask layer 411L may be formed as a layer including a carbon layer. The carbon layer may be formed of amorphous carbon. After the carbon layer is formed over the separation layer 300L, a second hard mask layer 412L may be further formed over the carbon layer. The second hard mask layer 412L may be formed as a layer covering and protecting the carbon layer. The second hard mask layer 412L may include a silicon oxynitride (SiON) layer formed over the carbon layer.

A resist layer 430L may be formed over the hard mask layer 410L. The resist layer 430L may include a resist material suitable for extreme ultraviolet (EUV) lithography process.

Figure 8:
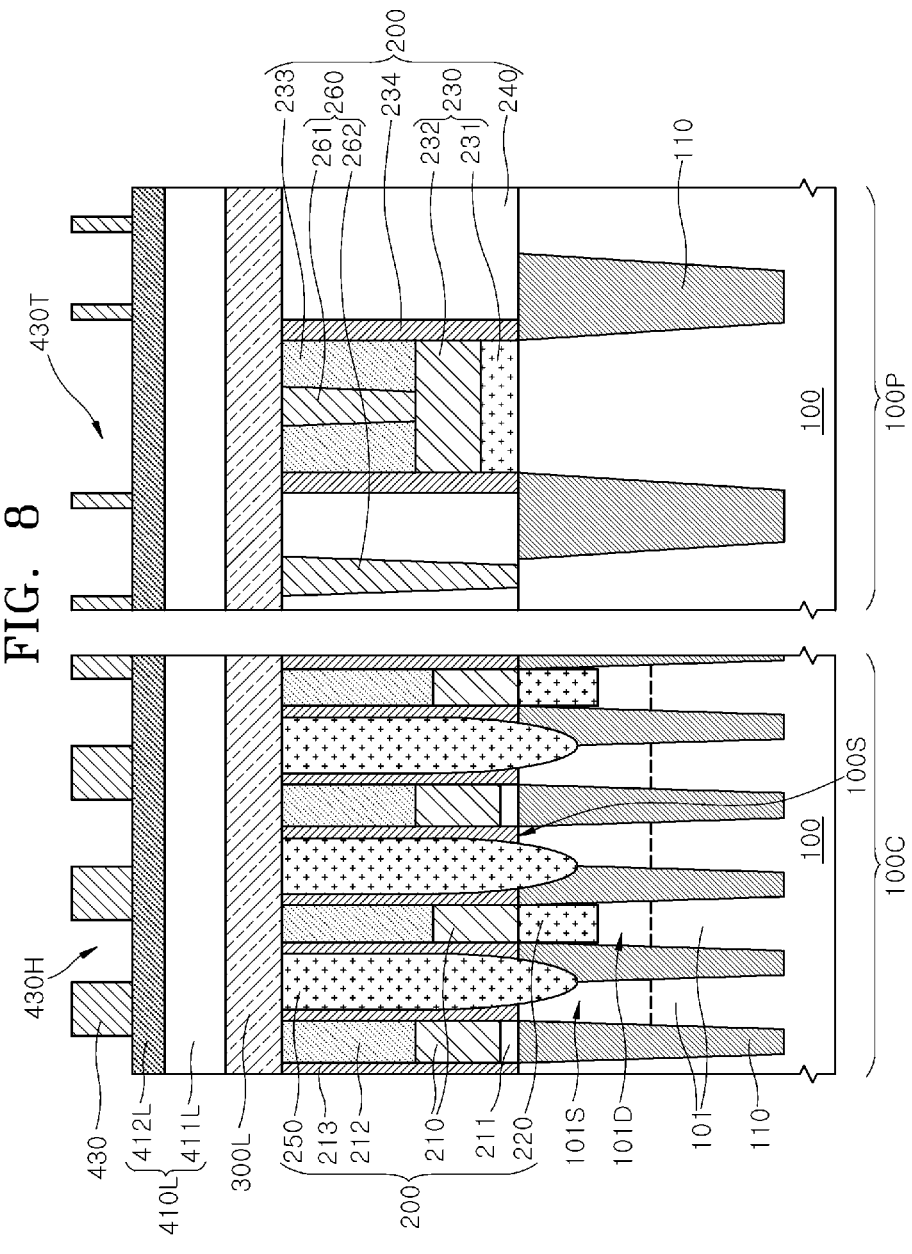

Referring to FIGS. 7 and 8, some portions of the resist layer 430L may be exposed by the EUV light, and developed to form a resist pattern 430. Some portions of the resist layer 430L located over the first region 100C and the second region 100P of the semiconductor substrate 100 may be selectively exposed. Specifically, an EUV reticle may be introduced over the resist layer 430L, and EUV rays reflected from the EUV reticle may be selectively incident on the portions of the resist layer 430L. The portions of the resist layer 430L to which the EUV rays are incident may be exposed, and the exposed portions May be developed and removed to form the resist pattern 430.

Figure 9:
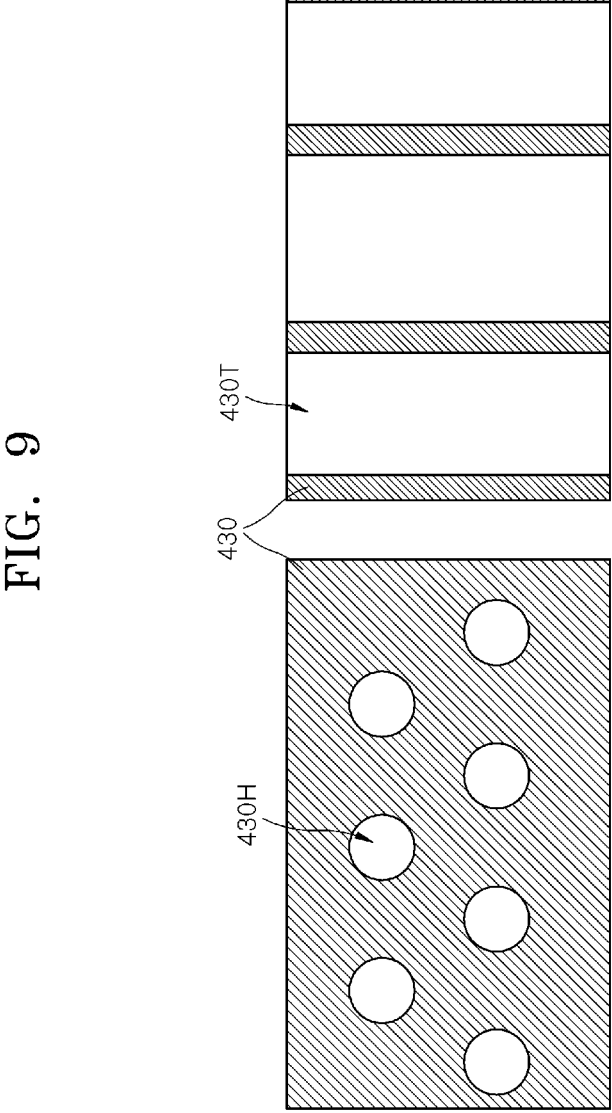

Referring to FIGS. 8 and 9, the resist pattern 430 may be formed to provide fifth openings 430H and sixth openings 430T. FIG. 9 is a schematic view illustrating a planar shape of the resist pattern 430 in FIG. 8. The fifth openings 430H of the resist pattern 430 may form holes in the separation layer 300L, and the sixth openings 430T may form elongated trenches in the separation layer 300L.

Figure 10:
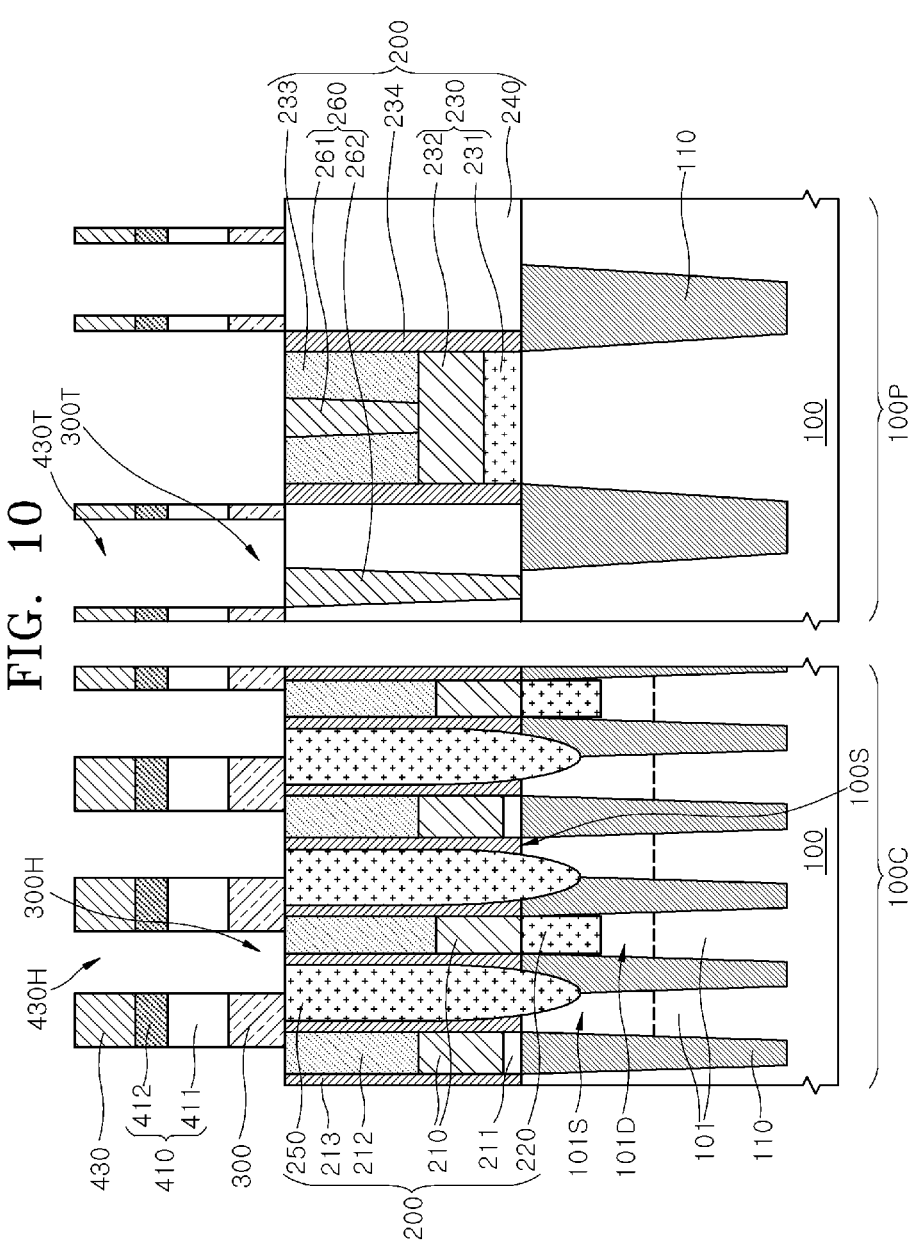

Referring to FIGS. 8 and 10, the portions of the hard mask layer 410L, exposed by the resist pattern 430 may be removed to form a hard mask pattern 410. Some portions of the second hard mask layer 412L which are exposed by the resist pattern 430 may be removed to form a second hard mask pattern 412. Also, some portions of the first hard mask layer 411L which are exposed by the second hard mask pattern 412 may be removed to form a first hard mask pattern 411. Some portions of the separation layer 300L which are exposed by the hard mask pattern 410 may be removed to form the separation pattern 300. The holes 300H and trenches 300T of the separation pattern 300 may be formed to have the shapes following the shapes of the fifth openings 430H and sixth openings 430T of the resist pattern 430, respectively. Thereafter, the hard mask pattern 410 and the resist pattern 430 may be removed.

The separation pattern 300 may be formed by a patterning process using the resist pattern 430 and the hard mask pattern 410, but the separation pattern 300 may be patterned without introducing the hard mask pattern 410. The resist layer (430 in FIG. 7) may be formed over the separation layer 300L to directly contact the separation layer 300L without introducing the hard mask layer (410L in FIG. 7) over the separation layer (300L in FIG. 7). The resist pattern 430 may be formed by using the EUV lithography process. The separation pattern 300 may be formed by removing the portions of the separation layer 300L which are exposed by the resist pattern 430.

Figure 11:
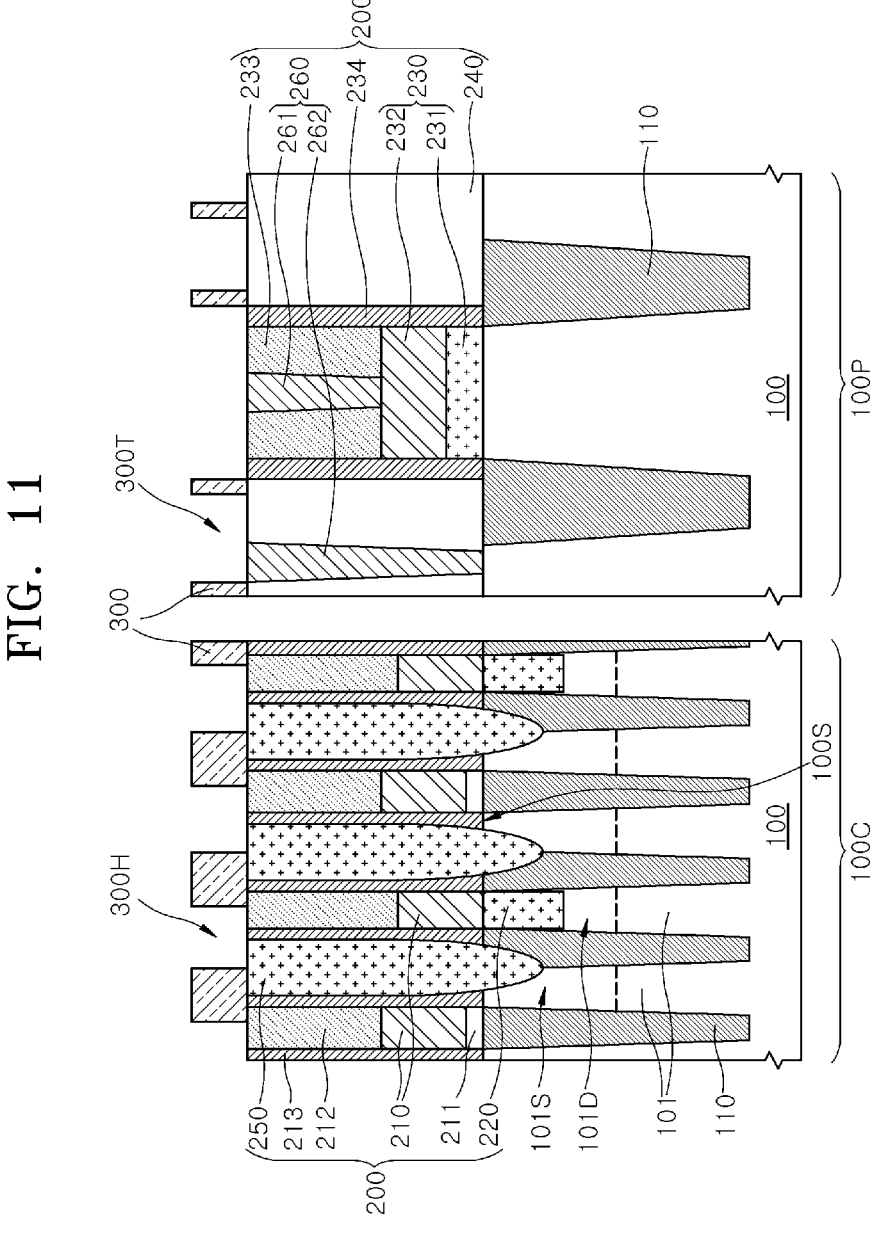
Figure 12:
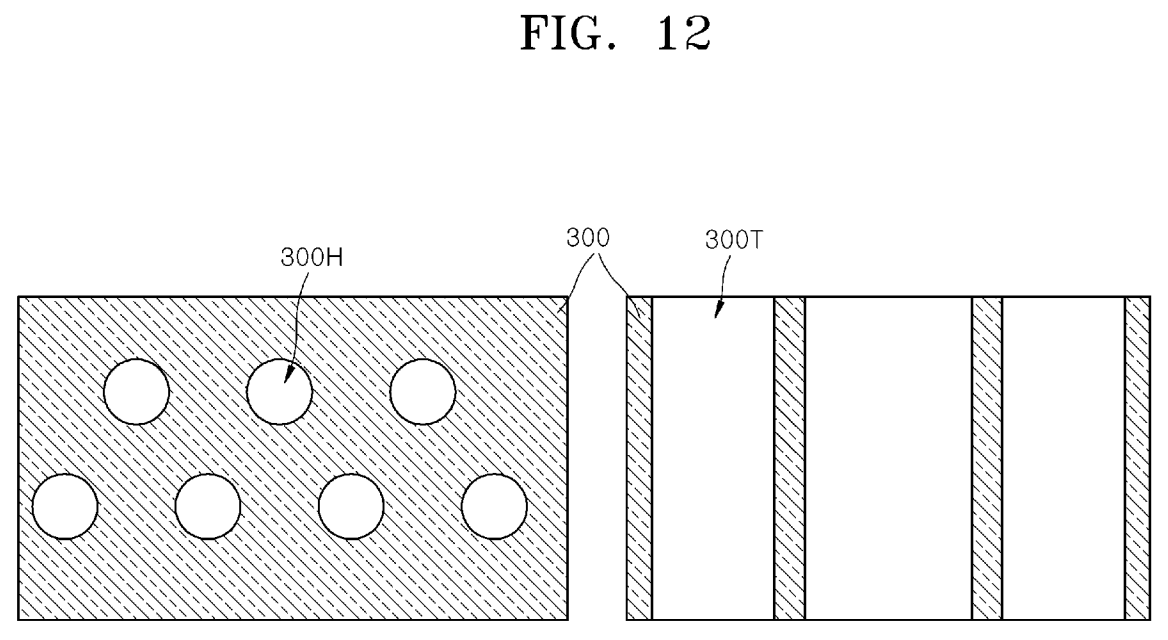

FIG. 11 is a schematic cross-sectional view illustrating the separation pattern 300. FIG. 12 is a schematic plan view illustrating a planar shape of the separation pattern 300 of FIG. 11. The separation pattern 300 may provide the holes 300H and the trenches 300T. The separation pattern 300 may be made of an insulating material such as, for example, silicon nitride ($Si_3N_4$). The separation pattern 300 may provide an arrangement of the holes 300H over the first region 100C of the semiconductor substrate 100. The separation pattern 300 may provide the trenches 300T over the second region 100P of the semiconductor substrate 100. The trenches 300T may be disposed at positions spaced apart from a group of the holes 300H.

The holes 300H may be formed as third openings exposing some portions of the first conductive pillars 250 at their bottom surfaces. The holes 300H may further expose some portions of bit line hard mask layers 212 at their bottom surfaces. The trenches 300T may be formed as fourth openings having an elongated shape while exposing some portions of the second conductive pillars 260 at their bottom surfaces. Some of the trenches 300T may be formed to expose some portions of the dielectric layer 240 at their bottom surfaces. Other portions of the trenches 300T may be formed to elongate while exposing some portions of the gate hard mask layer 233 at their bottom surfaces.

Figure 13:
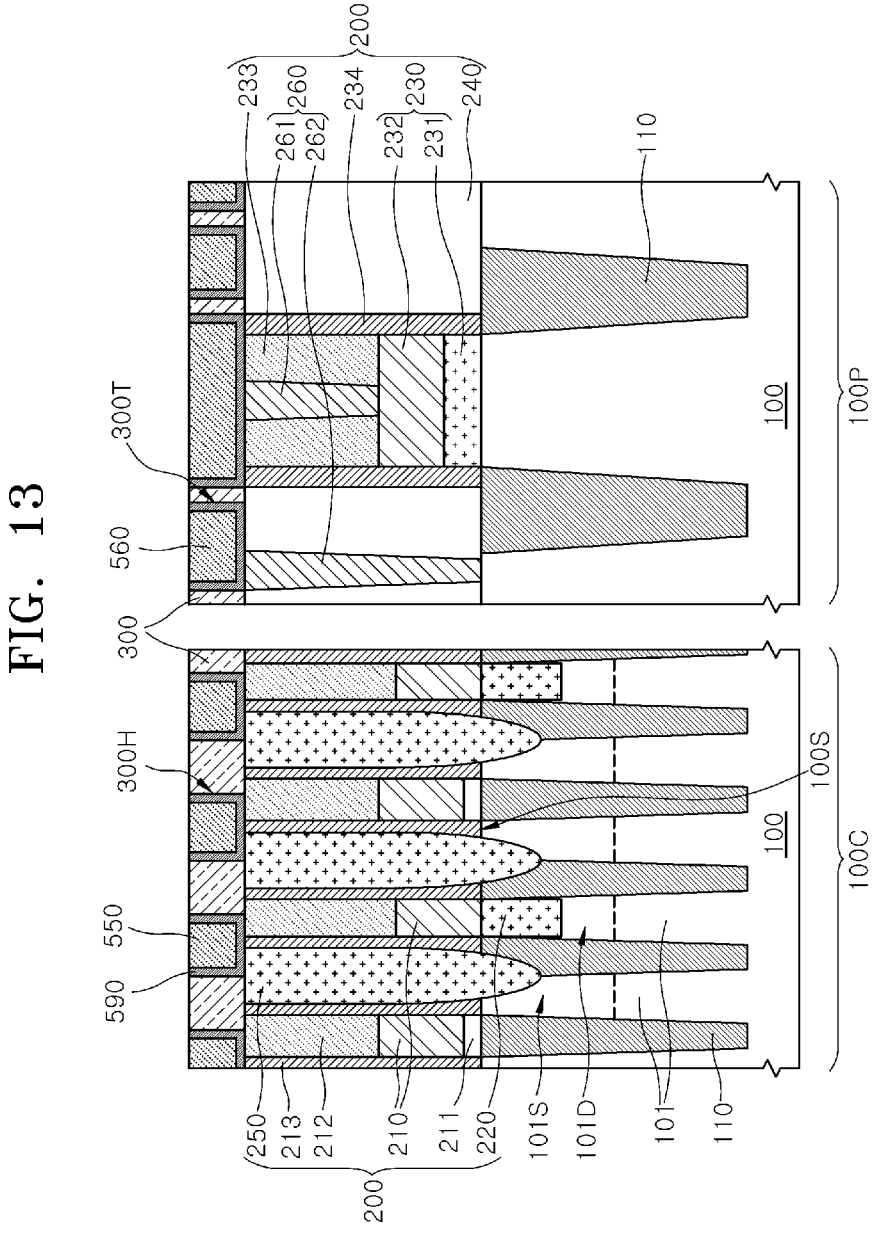
Figure 14:
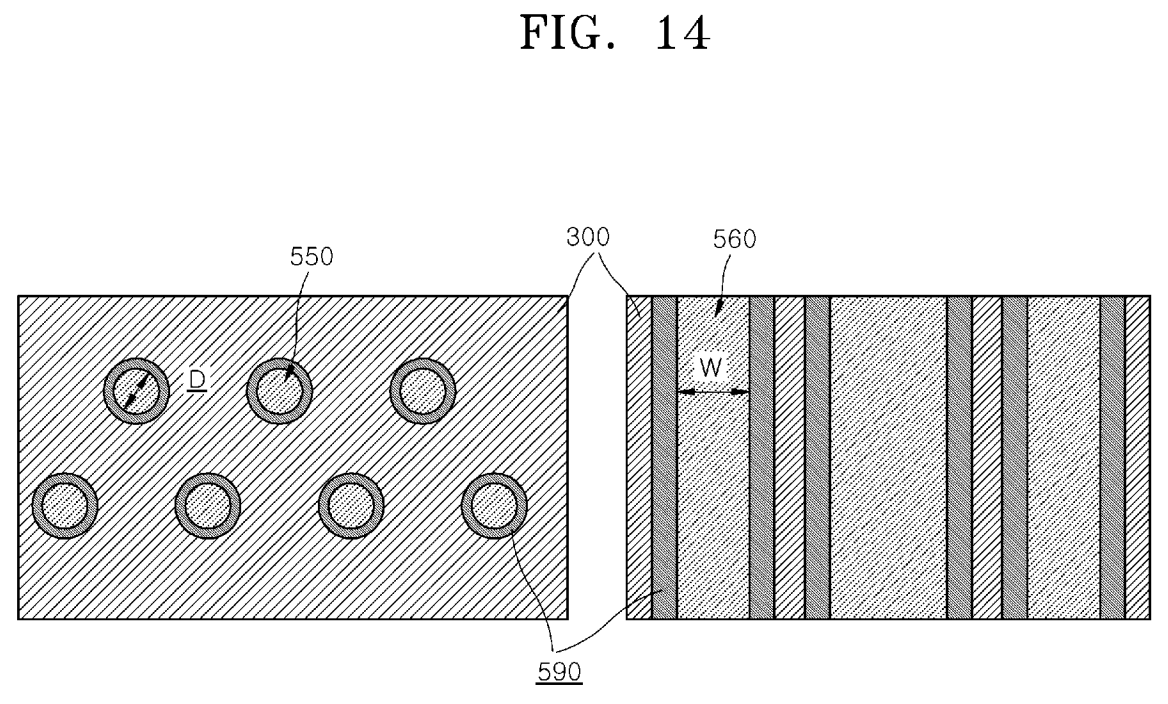

FIG. 13 is a schematic view illustrating formation of third conductive patterns 550 and fourth conductive patterns 560 in the method of manufacturing a semiconductor device according to an embodiment of the present disclosure. FIG. 14 is a schematic view illustrating planar shapes of the third conductive patterns 550 and the fourth conductive patterns 560 of FIG. 13.

Referring to FIGS. 13 and 14, the third conductive patterns 550 may be formed by filling the holes 300H of the separation pattern 300, while the fourth conductive patterns 560 may be formed by filling the trenches 300T of the separation pattern 300. Barriers 590 may be formed at the interfaces of the third and fourth conductive patterns 550 and 560 and the separation pattern 300. The barriers 590 may extend to interfaces of the third and fourth conductive patterns 550 and 560 and the intermediate structure layer 200. Each of the barriers 590 may be formed in a nest shape respectively surrounding side surfaces and bottom surfaces of the third and fourth conductive patterns 550 and 560. Each of the barriers 590 may have the form of a layer and may be made of a metal or metallic material such as, for example, titanium nitride (TIN), tungsten nitride (WN), titanium tungsten nitride (TiWN), tungsten silicon nitride (WSIN) or a combination thereof. Each of the barriers 590 may have the form of a composite layer.

Each of the third and fourth conductive patterns 550 and 560 may be, for example, a metal layer such as a tungsten (W) layer. The barriers 590 may prevent diffusion of metal ions from the third and fourth conductive patterns 550 and 560 to the intermediate structure layer 200. The diffusion of metal ions may cause an unwanted bridging phenomenon. The bridging phenomenon is a defect because the first conductive pillars 250 may electrically connect to each other which is undesirable.

A barrier layer covering the separation pattern 300 and extending into the holes 300H and the trenches 300T may be formed. A conductive layer may be formed over the barrier layer. The barriers 590 may be separated from the barrier layer by planarizing or chemically mechanically polishing the stack of the conductive layer and the barrier layer to expose the separation pattern 300. The third and fourth conductive patterns 550 and 560 may be formed to be isolated from each other by the separation pattern 300.

Referring to FIG. 14, each of the third conductive patterns 550 may be formed as an island pattern having a diameter D that is smaller than a width W of each of the fourth conductive patterns 560. The fourth conductive patterns 560 may be line-shaped patterns extending long in one direction. Each of the fourth conductive patterns 560 may be a pattern having a square or rectangular shape when viewed from a plan view. Each of the third conductive patterns 550 may be formed to have a smaller plane area and smaller volume than each of the fourth conductive patterns 560.

Figure 15:
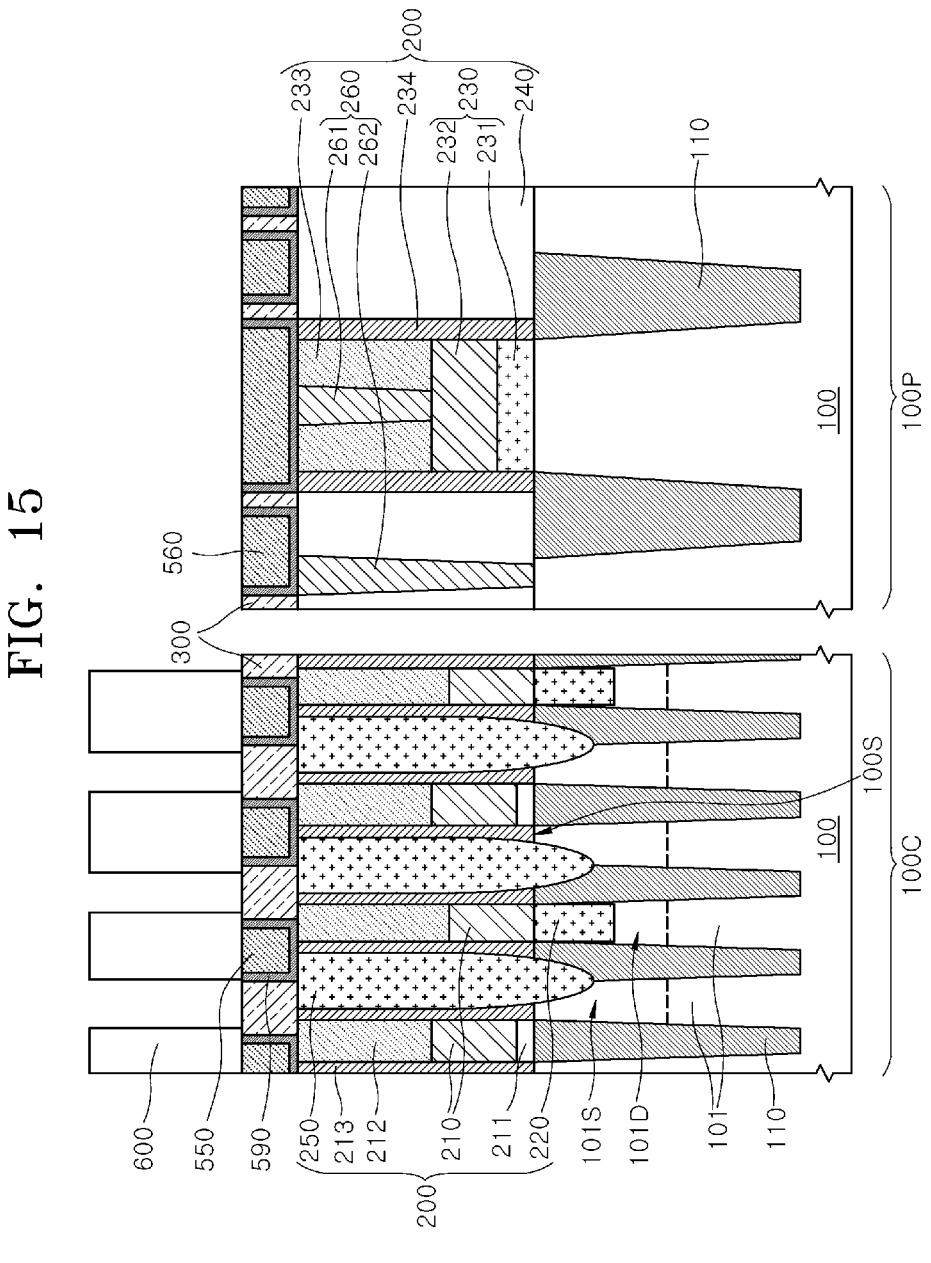
FIG. 15 is a schematic cross-sectional view illustrating formation of capacitors in the method of manufacturing a semiconductor device according to an embodiment of the present disclosure.

FIG. 15 is a schematic view illustrating capacitors 600 formed over and in direct contact to the third conductive patterns 550 according to an embodiment of the present disclosure.

Referring to FIG. 15, the capacitors 600 may be formed in the same number as the third conductive patterns 550 and each capacitor 600 may be connected to a corresponding one of the third conductive patterns 550. Each capacitor 600 may include a storage node, a capacitor dielectric layer and a plate node. The third conductive patterns 550 may respectively connect the capacitors 600 to the first conductive pillars 250, and the first conductive pillars 250 may respectively connect the capacitors 600 to the first doped regions 101S, which are source regions of the semiconductor substrate 100, together with the third conductive patterns 550. Some of the second conductive pillars 260 may connect some of the fourth conductive patterns 560 to the peripheral gate pattern 230. Others of the second conductive pillars 260 may connect some other ones of the fourth conductive patterns 560 to the semiconductor substrate 100.

Figure 16:
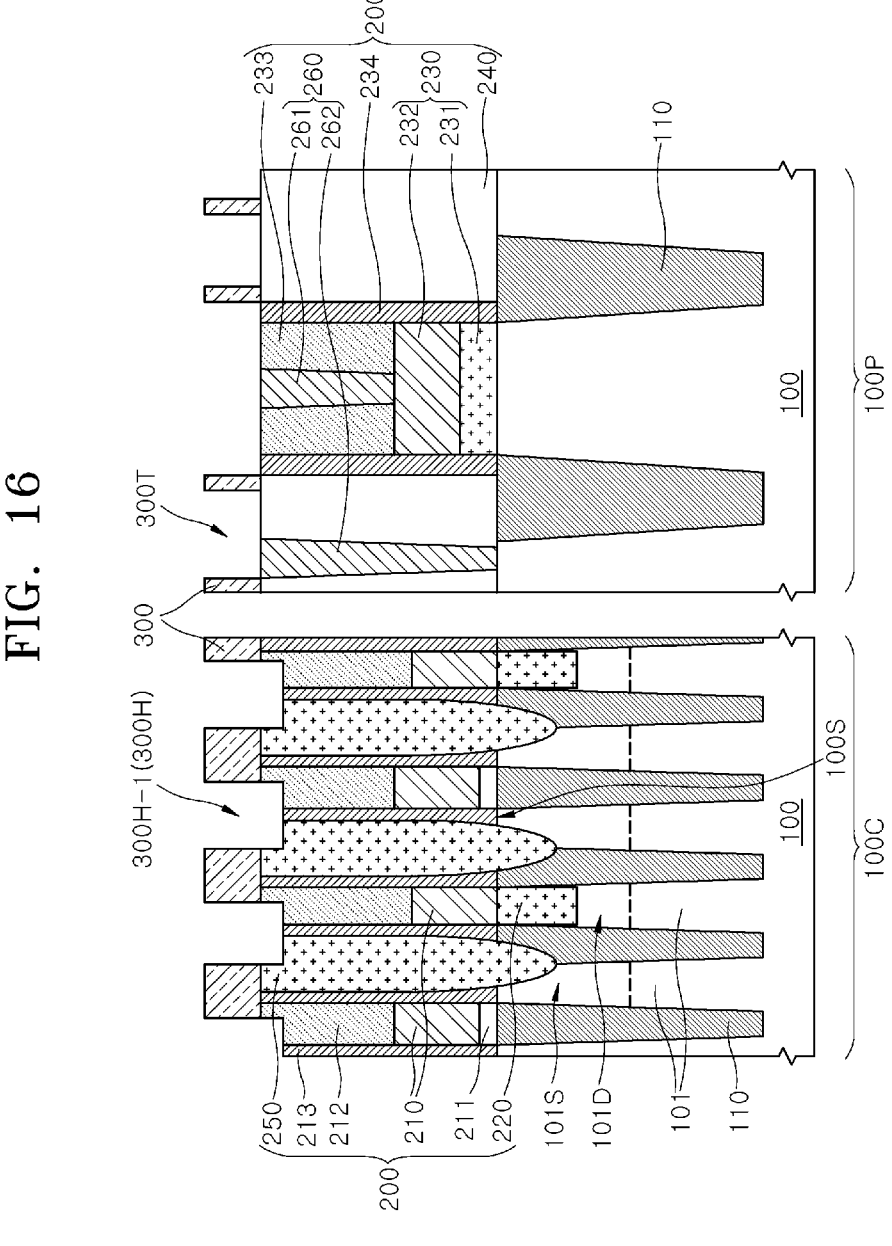
FIGS. 16 to 17 are schematic cross-sectional views illustrating a method of manufacturing a semiconductor device according to an embodiment of the present disclosure.
Figure 17:
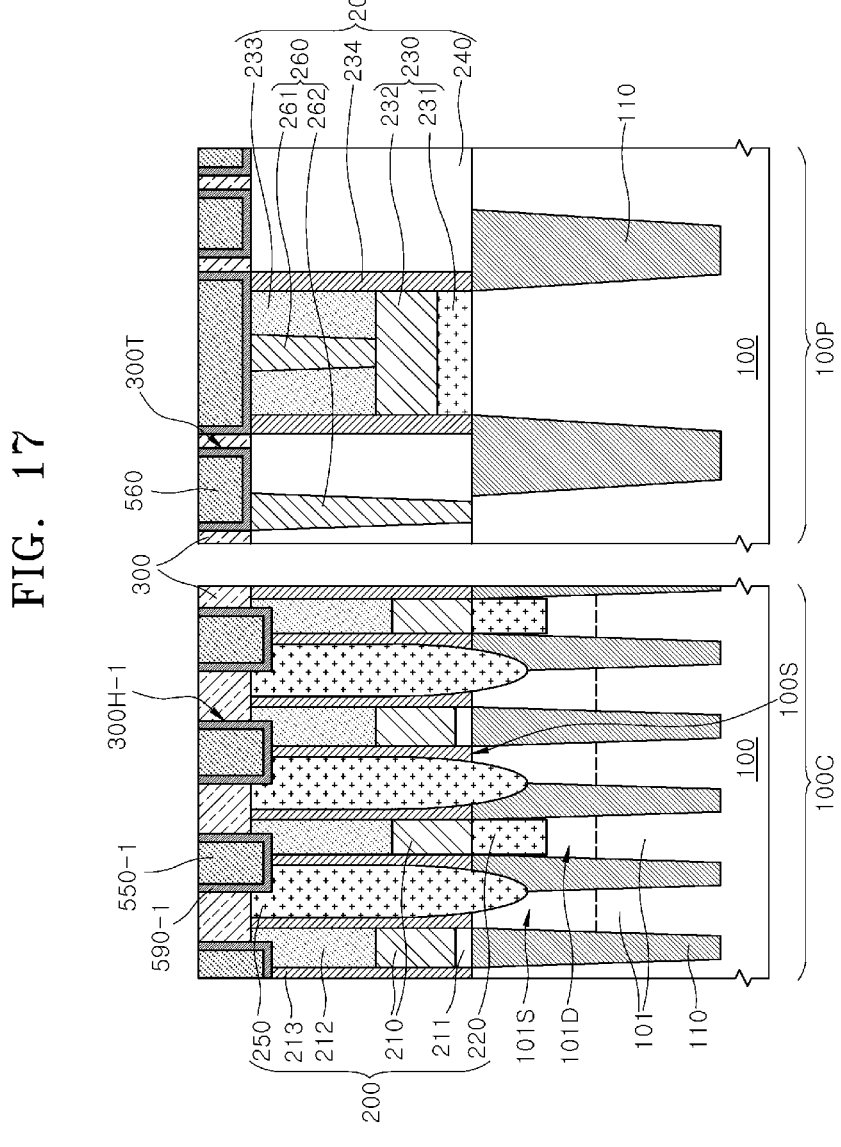

FIGS. 16 to 17 are schematic views illustrating a method of manufacturing a semiconductor device according to an embodiment of the present invention. In FIGS. 16 and 17, the same reference numerals as in FIGS. 1 to 15 may indicate the same elements.

Referring to FIGS. 16 and 17, some portions of the intermediate structure layer 200 which are exposed through the holes 300H of the separation pattern 300 may be further removed to expand the holes 300H in the depth direction. As shown in FIG. 11, after forming the separation pattern 300, the portions of the intermediate structure layer 200 which are exposed through the holes 300H of the separation pattern 300 may be selectively etched and removed to recess or expand the bottom surfaces of the holes 300H of the separation pattern 300 toward the semiconductor substrate 100. As the portions of the intermediate structure layer 200 which are exposed through the holes 300H of the separation pattern 300 are removed, the holes 300H are transformed into expanded holes 300H-1 which are deeper in the direction of the semiconductor substrate 100.

As the expanded, deeper holes 300H-1 of the separation pattern 300 are formed, the trenches 300T of the separation pattern 300 may also be expanded. Alternatively, the recess process of forming the expanded holes 300H-1 using a shielding pattern that shields and covers the second region 100P of the semiconductor substrate 100 may be restricted to be performed only in the first region 100C of the semiconductor substrate 100.

Referring to FIGS. 16 and 17, barriers 590-1 and third conductive patterns 550-1 filling the expanded holes 300H-1 of the separation pattern 300 may be formed. As the expanded holes 300H-1 of the separation pattern 300 are formed, some portions of the intermediate structure layer 200 may be removed. Because the portions of the upper portions of the first conductive pillars 250, which are parts of the intermediate structural layer 200, are removed, the surfaces of the first conductive pillars 250 which are exposed through the expanded holes 300H-1 may be further expanded. Because the barriers 590-1 are connected to the first conductive pillars 250 from which the portions of the upper portions are removed, the contact area between the first conductive pillars 250 and the barriers 590-1 may be improved. Accordingly, the contact resistance between the first conductive pillars 250 and the third conductive patterns 550-1 may be improved.

The inventive concept has been disclosed in conjunction with some embodiments as described above. Those skilled in the art will appreciate that various modifications, additions and substitutions are possible, without departing from the scope and spirit of the present invention disclosure. Accordingly, the embodiments disclosed in the present specification should be considered from not a restrictive standpoint but an illustrative standpoint. The scope of the inventive concept is not limited to the above descriptions but defined by the accompanying claims. All of distinctive features in the equivalent scope should be construed as being included in the inventive concept.

What is claimed is:

1. A method of manufacturing a semiconductor device, the method comprising:
   forming an intermediate structure layer including first conductive pillars and second conductive pillars over a semiconductor substrate;
   forming a separation layer covering the intermediate structure layer;
   forming a separation pattern by selectively removing portions of the separation layer, the separation pattern being formed to provide holes exposing portions of the first conductive pillars and trenches exposing portions of the second conductive pillars; and forming third conductive patterns filling the holes of the separation pattern and fourth conductive patterns filling the trenches of the separation pattern, wherein the intermediate structure layer further includes a gate pattern and bit line patterns formed over the semiconductor substrate, wherein one of the second conductive pillars is connected to the gate pattern, and wherein the first conductive pillars are formed to pass between the bit line patterns.

2. The method of claim 1, wherein forming the separation pattern includes:

forming a hard mask layer over the separation layer;

forming a resist layer over the hard mask layer;

exposing and developing the resist layer using extreme ultraviolet (EUV) to form a resist pattern;

removing some portions of the hard mask layer exposed through the resist pattern to form a hard mask pattern; and removing some portions of the separation layer, exposed through the hard mask layer.

3. The method of claim 2, wherein the hard mask layer is formed by stacking a plurality of layers of different materials.

4. The method of claim 2, wherein the hard mask layer includes:

a carbon layer formed over the separation layer; and a silicon oxynitride (SiON) layer formed over the carbon layer.

5. The method of claim 1, wherein the separation layer includes a silicon nitride layer.

6. The method of claim 1, wherein forming the separation pattern includes:

forming a resist layer over the separation layer;

exposing and developing the resist layer using extreme ultraviolet (EUV) to form a resist pattern; and removing the portions of the separation layer, exposed to the resist pattern.

7. The method of claim 1, further comprising forming barriers between the third and fourth conductive patterns and the separation pattern.

8. The method of claim 7, wherein the barriers are formed to further extend to interfaces between the third and fourth conductive patterns and the intermediate structure layer.

9. The method of claim 1, wherein each of the third and fourth conductive patterns includes a tungsten (W) layer.

10. The method of claim 1, wherein the third conductive patterns are formed to each have a smaller plane area and a smaller volume than the fourth conductive patterns.

11. The method of claim 1, wherein each of the third conductive patterns is formed to have a diameter smaller than a width of each of the fourth conductive patterns.

12. The method of claim 1, further comprising forming capacitors respectively connected to the third conductive patterns.

13. The method of claim 1, wherein other portions of the second conductive pillars are formed to connect other portions of the fourth conductive patterns to the semiconductor substrate.

14. The method of claim 1, wherein the bit line patterns are formed to be respectively connected to conductive bit line plugs formed to pass through into portions of the semiconductor substrate.

15. The method of claim 1, wherein the first conductive pillars are formed such that some portions pass through into the semiconductor substrate.

16. The method of claim 1, further comprising further removing some portions of the intermediate structure layer, exposed through the holes of the separation pattern to expand the holes.

17. A method of manufacturing a semiconductor device, the method comprising:

forming an intermediate structure layer including first and second conductive pillars extending over a cell region and a peripheral region of a semiconductor substrate, respectively;

forming a separation pattern comprising holes exposing portions of the first conductive pillars and trenches exposing portions of the second conductive pillars; and forming conductive patterns by filling the holes and the trenches of the separation pattern, wherein the intermediate structure layer further includes a gate pattern and bit line patterns formed over the semiconductor substrate, wherein one of the second conductive pillars is connected to the gate pattern, and wherein the first conductive pillars are formed to pass between the bit line patterns.

* * * * *